(12) United States Patent
Pan

(10) Patent No.: US 11,710,436 B2
(45) Date of Patent: Jul. 25, 2023

(54) GOA CIRCUIT AND DISPLAY PANEL

(71) Applicant: WUHAN CHINA STAR OPTOELECTRONICS TECHNOLOGY CO., LTD., Wuhan (CN)

(72) Inventor: You Pan, Wuhan (CN)

( * ) Notice: Subject to any disclaimer, the term of this patent is extended or adjusted under 35 U.S.C. 154(b) by 353 days.

(21) Appl. No.: 16/972,626

(22) PCT Filed: Nov. 20, 2020

(86) PCT No.: PCT/CN2020/130525
§ 371 (c)(1),
(2) Date: Dec. 7, 2020

(87) PCT Pub. No.: WO2022/088318
PCT Pub. Date: May 5, 2022

(65) Prior Publication Data
US 2022/0351658 A1 Nov. 3, 2022

(30) Foreign Application Priority Data
Nov. 2, 2020 (CN) .......................... 202011203876.8

(51) Int. Cl.
*G09G 3/20* (2006.01)
*H01L 27/12* (2006.01)

(52) U.S. Cl.
CPC .............. *G09G 3/20* (2013.01); *H01L 27/124* (2013.01); *G09G 2300/0408* (2013.01); *G09G 2310/0267* (2013.01); *G09G 2310/08* (2013.01); *G09G 2330/027* (2013.01)

(58) Field of Classification Search
CPC ...... G09G 3/3674; G09G 3/3266; G09G 3/20; G09G 2354/00; G09G 2310/063; G09G 2310/08; G09G 2310/0267; G09G 2310/062; G09G 2300/0408; G09G 2330/027; H01L 27/124
See application file for complete search history.

(56) References Cited

U.S. PATENT DOCUMENTS

| 2006/0066550 | A1 | 3/2006 | Huang et al. | |
| 2015/0356934 | A1* | 12/2015 | Yamashita | G09G 3/3611 |
| | | | | 345/99 |
| 2016/0163264 | A1* | 6/2016 | Nishimura | G09G 3/3266 |
| | | | | 345/212 |
| 2017/0178581 | A1* | 6/2017 | Li | G09G 3/20 |

FOREIGN PATENT DOCUMENTS

| CN | 105118464 A | 12/2015 |
| CN | 105206237 A | 12/2015 |
| CN | 106128401 A | 11/2016 |

(Continued)

*Primary Examiner* — Christopher E Leiby

(57) ABSTRACT

The present application provides a GOA circuit and a display panel. In the GOA circuit, one of two GOA units of a same stage in GOA sub circuits at left and right sides of the display panel is deployed only with an all-on module and the other one of the two GOA units is deployed only with an all-off module. In such a way, both the number of the all-on modules and the number of the all-off modules required in the GOA unit are halved, thereby reducing the area occupied by the GOA circuit. It is beneficial for realizing a display panel with a narrow bezel.

12 Claims, 5 Drawing Sheets

(56) References Cited

FOREIGN PATENT DOCUMENTS

| | | | |
|---|---|---|---|
| CN | 108735141 | A | 11/2018 |
| CN | 108806581 | A | 11/2018 |
| CN | 109147711 | A | 1/2019 |
| CN | 109360533 | A | 2/2019 |
| CN | 109581773 | A | 4/2019 |
| CN | 111477155 | A | 7/2020 |
| JP | 4196922 | B2 | 12/2008 |

* cited by examiner

GOA CIRCUIT AND DISPLAY PANEL

FIELD OF THE DISCLOSURE

The present application relates to display technologies, and more particularly to a GOA circuit and a display panel.

DESCRIPTION OF RELATED ARTS

Gate driver on array (GOA) technology refers to integrating a gate driving circuit of a display panel on a glass substrate to realize the scanning and driving of the display panel. The GOA technology can reduce a process of external IC bonding, decreases the cost of products, and is applicable to display products with narrow bezels.

The GOA circuit includes a plurality of cascaded GOA units, and each stage of GOA units outputs a scan signal by a scan line to drive thin-film transistors at a corresponding row of pixels to be switched on or off. The GOA circuit has an all-gate-on function and an all-gate-off function. The all-gate-on function means that at the time the display panel is powered on or powered off, each stage of GOA units simultaneously outputs a high-level scan signal to switch on the thin-film transistors of all pixels and simultaneously applies a black voltage or an intermediate voltage to all the pixels to clear residual charges on the display panel, thereby preventing a ghosting image from being occurred on the display panel. The all-gate-off function means that at the time the display panel is changed from a display phase to a touch phase, each stage of GOA units simultaneously outputs a low-level scan signal to switch off the thin-film transistors of all pixels, thereby preventing from interference by other signals in the touch phase.

Technical Problems

FIG. 1 is a structural schematic diagram showing a GOA circuit with a dual-side driving function in an existing art. As shown in FIG. 1, the existing dual-side driving GOA circuit is generally deployed with all-on modules and all-off modules at each of left and right sides of the display panel so as to carry out all-gate-on and all-gate-off functions. However, this will make the structure of the GOA circuit more complicated, lead to a large occupied area and enlarge a width of the display panel. It is not beneficial for realizing a display panel with a narrow bezel.

Technical Solutions

In order to reduce an area occupied by a GOA circuit on a display panel to reduce a bezel of a display panel, the present application provides a gate driver on array (GOA) circuit, including a first GOA sub circuit disposed at one side of a display panel and a second GOA sub circuit disposed at another side of the display panel, wherein each of the first GOA sub circuit and the second GOA sub circuit includes a plurality of cascaded GOA units, two GOA units of a same stage in the first GOA sub circuit and the second GOA sub circuit jointly drive a same scan line, wherein one of the two GOA units of a same stage includes one of an all-on module and an all-off module, and the other one of the two GOA units includes the other one of the all-on module and the all-off module, the all-on module is configured to simultaneously switch on thin-film transistors of all pixels connected to the scan line, and the all-off module is configured to simultaneously switch off the thin-film transistors of all the pixels connected to the scan line.

In some embodiments, the first GOA sub circuit only includes the all-on module and the second GOA sub circuit only includes the all-off module.

In some embodiments, the first GOA sub circuit only includes the all-off module and the second GOA sub circuit only includes the all-on module.

In some embodiments, one of two cascaded GOA units in the first GOA sub circuit or the second GOA sub circuit only includes the all-on module, and the other one of the two cascaded GOA units only includes the all-off module.

In some embodiments, the all-on module includes a first thin-film transistor, both a gate and a source of the first thin-film transistor are fed with an all-on signal, and a drain of the first thin-film transistor is connected to a corresponding scan signal output end.

In some embodiments, the all-off module includes a second thin-film transistor, a gate of the second thin-film transistor is fed with an all-off signal, a source of the second thin-film transistor is fed with a constant low voltage level, and a drain of the second thin-film transistor is connected to a corresponding scan signal output end.

In some embodiments, the all-on signal is a high voltage-level signal if the first thin-film transistor is a N-type thin-film transistor; and the all-on signal is a low voltage-level signal if the first thin-film transistor is a P-type thin-film transistor.

In some embodiments, the all-off signal is a high voltage-level signal if the second thin-film transistor is a N-type thin-film transistor; and the all-off signal is a low voltage-level signal if the second thin-film transistor is a P-type thin-film transistor.

In some embodiments, the two GOA units of a same stage in the first GOA sub circuit and the second GOA sub circuit are fed with a same clock signal, or are fed with two clock signals of a same timing, respectively.

In addition, the present application further provides a display panel including a gate driver on array (GOA) circuit, which includes a first GOA sub circuit disposed at one side of a display panel and a second GOA sub circuit disposed at another side of the display panel, wherein each of the first GOA sub circuit and the second GOA sub circuit includes a plurality of cascaded GOA units, two GOA units of a same stage in the first GOA sub circuit and the second GOA sub circuit jointly drive a same scan line, wherein one of the two GOA units of a same stage includes one of an all-on module and an all-off module, and the other one of the two GOA units includes the other one of the all-on module and the all-off module, the all-on module is configured to simultaneously switch on thin-film transistors of all pixels connected to the scan line, and the all-off module is configured to simultaneously switch off the thin-film transistors of all the pixels connected to the scan line.

In some embodiments, the first GOA sub circuit only includes the all-on module and the second GOA sub circuit only includes the all-off module.

In some embodiments, the first GOA sub circuit only includes the all-off module and the second GOA sub circuit only includes the all-on module.

In some embodiments, one of two cascaded GOA units in the first GOA sub circuit or the second GOA sub circuit only includes the all-on module, and the other one of the two cascaded GOA units only includes the all-off module.

In some embodiments, the all-on module includes a first thin-film transistor, both a gate and a source of the first thin-film transistor are fed with an all-on signal, and a drain of the first thin-film transistor is connected to a corresponding scan signal output end.

In some embodiments, the all-off module includes a second thin-film transistor, a gate of the second thin-film transistor is fed with an all-off signal, a source of the second thin-film transistor is fed with a constant low voltage level, and a drain of the second thin-film transistor is connected to a corresponding scan signal output end.

In some embodiments, the all-on signal is a high voltage-level signal if the first thin-film transistor is a N-type thin-film transistor; and the all-on signal is a low voltage-level signal if the first thin-film transistor is a P-type thin-film transistor.

In some embodiments, the all-off signal is a high voltage-level signal if the second thin-film transistor is a N-type thin-film transistor; and the all-off signal is a low voltage-level signal if the second thin-film transistor is a P-type thin-film transistor.

In some embodiments, the two GOA units of a same stage in the first GOA sub circuit and the second GOA sub circuit are fed with a same clock signal, or are fed with two clock signals of a same timing, respectively.

Beneficial Effects

The present application provides a GOA circuit and a display panel. Different from the existing GOA circuit that needs to be deployed with both all-on modules and all-off modules at left and right sides of the display panel to realize all-gate-on and all-gate-off functions, the GOA circuit is deployed such that one of two GOA units of a same stage in the GOA sub circuits at left and right sides of the display panel is deployed only with an all-on module and the other one of the two GOA units is deployed only with an all-off module. In such a way, both the number of the all-on modules and the number of the all-off modules included in the GOA unit are halved. In a case that the GOA circuit is applied to a display panel in a dual-side driving line-by-line scanning framework, the area occupied by the GOA circuit on the display panel can be reduced on the promise that the all-gate-on and all-gate-off functions are not affected. It is beneficial for realizing a display panel with high resolution and a narrow bezel.

DESCRIPTION OF EMBODIMENTS OF THE DISCLOSURE

Figure 1:
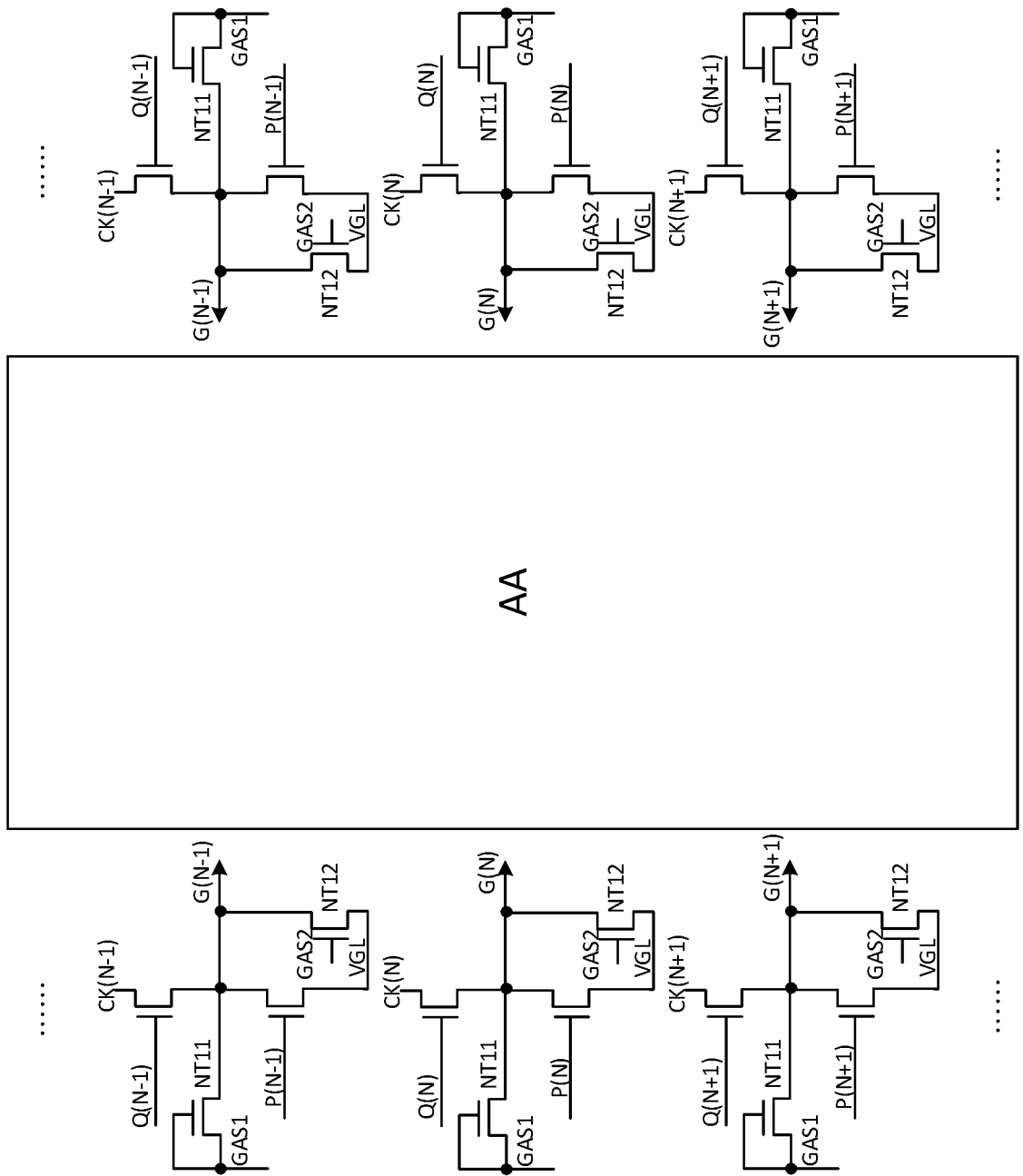
FIG. 1 is a structural schematic diagram showing a GOA circuit with a dual-side driving function in an existing art.

To make the objectives, technical schemes, and effects of the present application more clear and specific, the present application is described in further detail below with reference to the embodiments in accompanying with the appending drawings. It should be understood that the specific embodiments described herein are merely for interpreting the present application and the present application is not limited thereto.

In all of the embodiments of the present application, in order to distinguish two electrodes of a thin-film transistor except for a gate, one of the two electrodes is called a source and the other one of the two electrodes is called a drain. Since the source and the drain of the thin-film transistor are symmetrical in a sense, the source and the drain are interchangeable. A middle end of the thin-film transistor is the gate, a signal input end of the thin-film transistor is the source, and a signal output end of the thin-film transistor is the drain, as specified according to a shape or pattern shown in the appending figures. In addition, the thin-film transistors utilized in all the embodiments of the present application may include P-type transistors and/or N-type transistors. The P-type transistor is turned on when the gate is at low voltage level and is turned off when the gate is at high voltage level; the N-type transistor is turned on when the gate is at high voltage level and is turned off when the gate is at low voltage level.

The existing GOA circuit is usually deployed with all-on modules and all-off modules at left and right sides of a display panel so as to carry out all-gate-on and all-gate-off functions of the GOA circuit. However, this will make the structure of the GOA circuit more complicated, lead to a large occupied area and enlarge a width of the display panel. It is not beneficial for realizing a display panel with a narrow bezel.

To solve above problems, an embodiment of the present application provides a gate driver on array (GOA) circuit. The GOA circuit includes a first GOA sub circuit disposed at one side of a display panel and a second GOA sub circuit disposed at another side of the display panel. Each of the first GOA sub circuit and the second GOA sub circuit includes a plurality of cascaded GOA units. Two GOA units of a same stage in the first GOA sub circuit and the second GOA sub circuit jointly drive a same scan line. One of the two GOA units of a same stage includes one of an all-on module 101 and an all-off module 102, and the other one of the two GOA units includes the other one of the all-on module 101 and the all-off module 102. The all-on module 101 is configured to simultaneously switch on thin-film transistors of all pixels connected to the scan line, and the all-off module 102 is configured to simultaneously switch off the thin-film transistors of all the pixels connected to the scan line.

Specifically, in the GOA circuit provided in the embodiment of the present application, one of two GOA units of a same stage in the GOA sub circuits at left and right sides of the display panel is deployed only with an all-on module 101 and the other one of the two GOA units is deployed only with an all-off module 102. In such a way, both the number of the all-on modules 101 and the number of the all-off modules 102 included in the GOA unit are halved. In a case that the GOA circuit is applied to a display panel in a dual-side driving line-by-line scanning framework, the area occupied by the GOA circuit on the display panel can be reduced on the promise that the all-gate-on and all-gate-off functions are not affected. It is beneficial for realizing a display panel with high resolution and a narrow bezel.

It needs to be noted that implementing dual-side driving of the display panel by the GOA circuit refers to disposing GOA sub circuits at left and right sides of a display area of the display panel, each of the GOA sub circuits including GOA units from a first stage to a last stage, and implementing the driving of the display panel from the left side and the right side by the GOA sub circuits at the two sides. The dual-side driving line-by-line scanning framework refers to jointly driving pixels of a same row by two GOA units of a same stage, where the timing or clock for the GOA sub circuits at the two sides is the same. In addition, dual-side driving interlaced scanning framework refers to that the timing or clock for the GOA sub circuits at the two sides is different, the GOA sub circuit at one side are used to drive odd rows of pixels and the GOA sub circuit at the other side are used to drive even rows of pixels, and the GOA sub circuits take turns to drive odd rows of pixels and even rows of pixels.

In a case of the dual-side driving line-by-line scanning framework, since a certain row of pixels are driven jointly by the GOA sub circuit at one side and the GOA sub circuit at the other side, the GOA sub circuit at one side and the GOA sub circuit at the other side are deployed only with the all-on modules 101 and are deployed only with the all-off modules 102, respectively, for that the all-on module 101 and the all-off module 102 of a same stage can act on a same row of pixels. In a case of the dual-side driving interlaced scanning framework, a certain row of pixels can only be driven by the GOA sub circuit at one side or by the GOA sub circuit at the other side. If the GOA sub circuit at one side and the GOA sub circuit at the other side are deployed with the all-on modules 101 and the all-off module 102 respectively, the row of pixels can only have the all-on module 101 or the all-off module 102. In this way, only the all-gate-on function or the all-gate-off function can be realized, and the all-gate-on function and the all-gate-off function cannot be achieved altogether. Therefore, to allow the pixels of a same row to be with the all-gate-on function and the all-gate-off function altogether, the GOA provided in the embodiment of the present application is only applicable to a display panel in the dual-side driving line-by-line scanning framework and may be not be suitable for a display panel in the dual-side driving interlaced scanning framework.

It can be understood that one of the two GOA units at a same stage is deployed only with the all-on module 101 and the other one is deployed only with the all-on module 102, and this may be achieved by disposing only the all-on modules 101 at one side and only the all-off modules 102 at the other side, or by disposing the all-on modules 101 and the all-off modules 102 at intervals for N cascaded GOA units at a same side. Based on this, two specific embodiments of the GOA circuit are given below.

In the embodiment of the present application, G(N−1), G(N), G(N+1), . . . in the appending figures each represents scan signal output ends of the GOA units at a same stage in the first GOA sub circuit and the second GOA sub circuit of the GOA circuit and is configured to output a scan signal for each stage of GOA units. Q(N−1), Q(N), Q(N+1) . . . each represents pull-up nodes of the GOA units at a same stage in the first GOA sub circuit and the second GOA sub circuit of the GOA circuit and is configured to pull up the scan signal of each stage of GOA units. P(N−1), P(N), P(N+1) . . . each represents pull-down nodes of the GOA units at a same stage in the first GOA sub circuit and the second GOA sub circuit of the GOA circuit and is configured to pull down the scan signal of each stage of GOA units.

Figure 2:
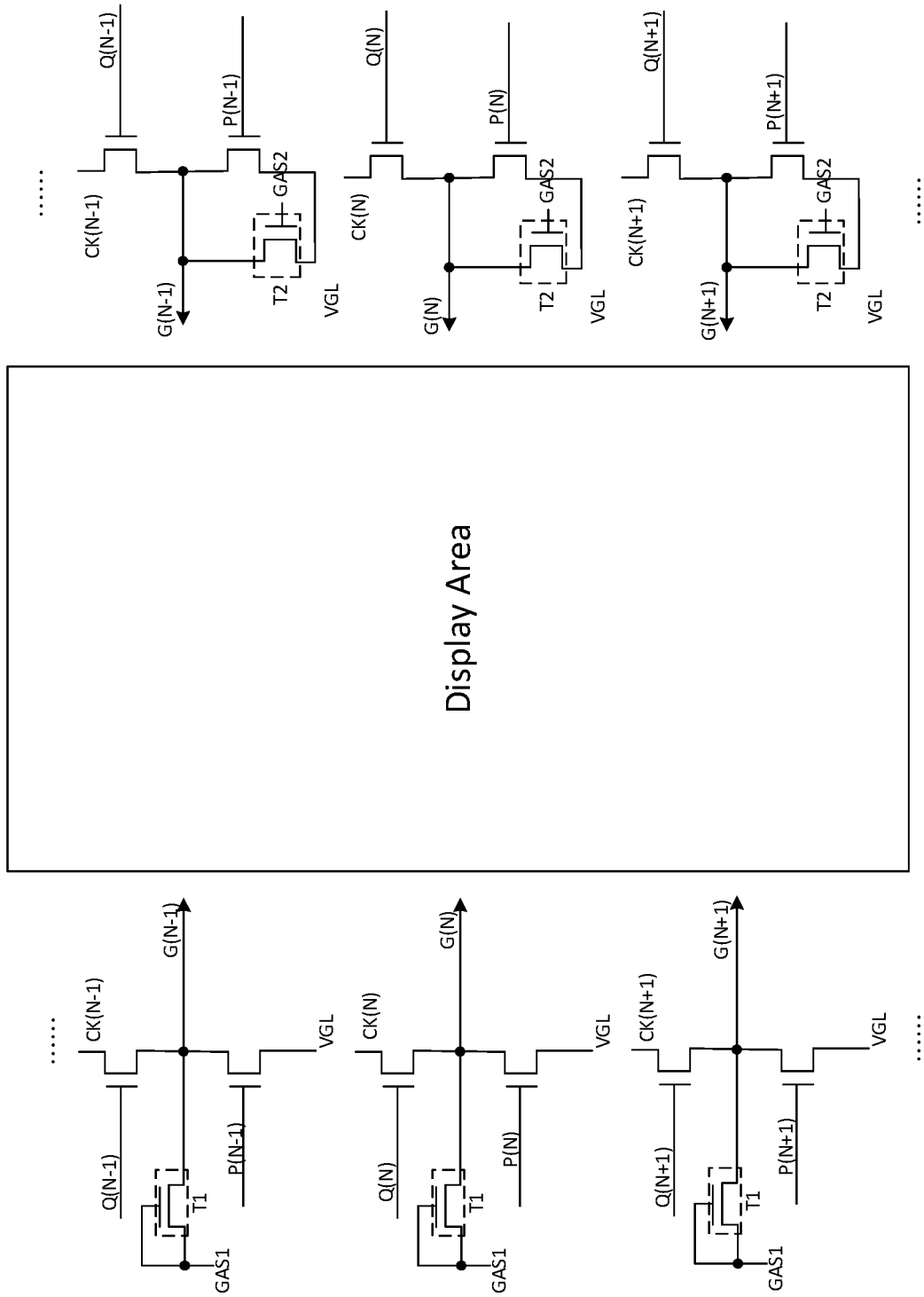
FIG. 2 is a structural schematic diagram showing a first type of GOA circuit provided in an embodiment of the present application.

FIG. 2 is a structural schematic diagram showing a first type of GOA circuit provided in an embodiment of the present application. As shown in FIG. 2, the structure of the GOA circuit may be a structure in which the first GOA sub circuit only includes the all-on modules 101 and the second GOA sub circuit only includes the all-off modules 102.

Likewise, the structure of the GOA circuit can also be a structure in which the first GOA sub circuit only includes the all-off modules 102 and the second GOA sub circuit only includes the all-on modules 101.

Figure 3:
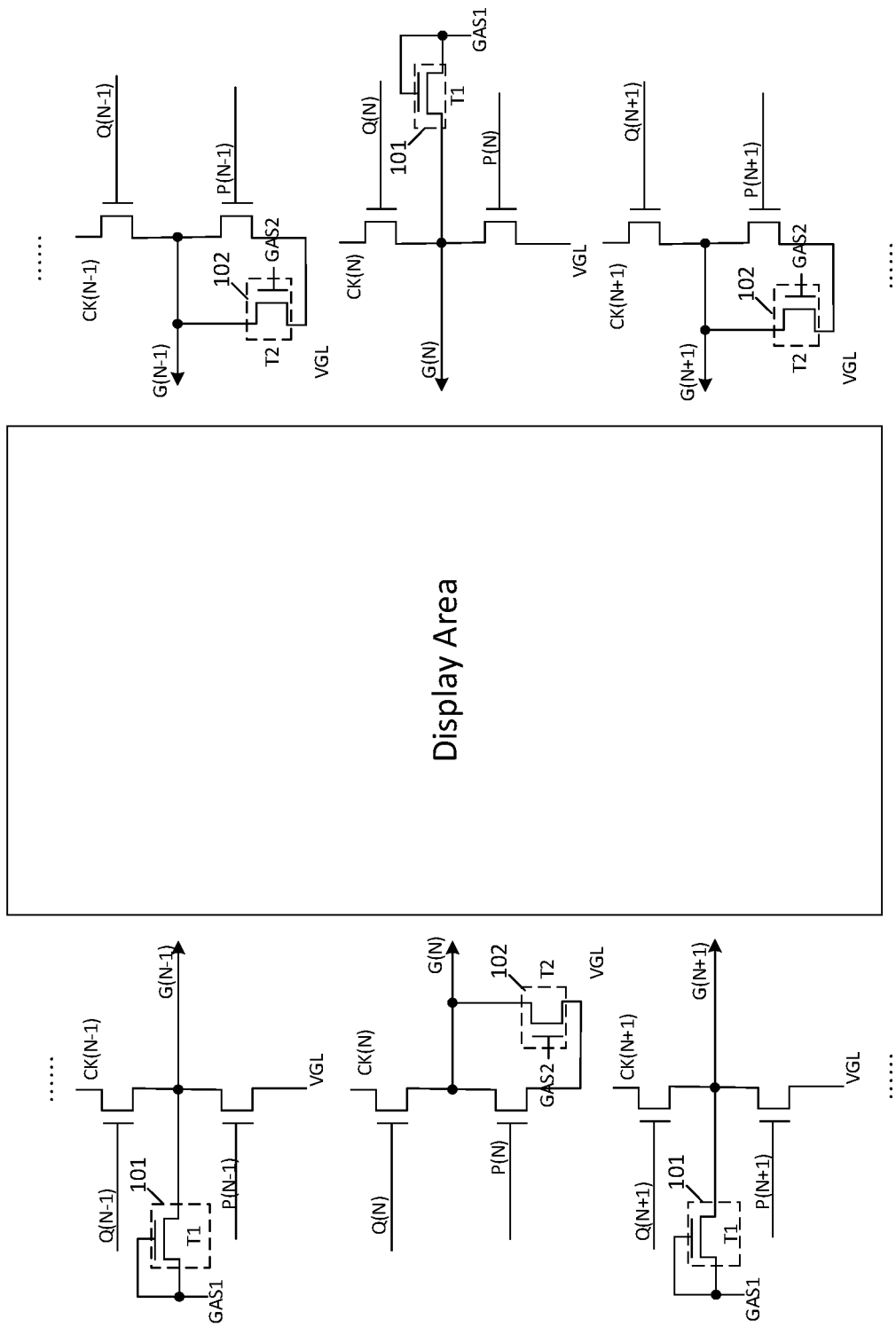
FIG. 3 is a structural schematic diagram showing a second type of GOA circuit provided in an embodiment of the present application.

FIG. 3 is a structural schematic diagram showing a second type of GOA circuit provided in an embodiment of the present application. As shown in FIG. 3, one of two cascaded GOA units in the first GOA sub circuit or the second GOA sub circuit only includes the all-on module 101, and the other one of the two cascaded GOA units only includes the all-off module 102.

As shown in FIG. 2 or FIG. 3, the all-on module 101 includes a first thin-film transistor T1, both the gate and the source of the thin-film transistor T1 are fed with an all-on signal GAS1, and the drain of the first thin-film transistor T1 is connected to a corresponding scan signal output end.

Alternatively, the gate of the first thin-film transistor T1 is fed with an all-on signal GAS1, the source of the first thin-film transistor T1 is fed with a constant high voltage level VGH (not shown), and the drain of the first thin-film transistor T1 is connected to a corresponding scan signal output end.

As shown in FIG. 2 or FIG. 3, the all-off module 102 includes a second thin-film transistor T2, the gate of the second thin-film transistor T2 is fed with an all-off signal GAS2, the source of the second thin-film transistor T2 is fed with a constant low voltage level VGL, and the drain of the second thin-film transistor T2 is connected to a corresponding scan signal output end.

In some embodiments, the all-on signal GAS1 is a high voltage-level signal if the first thin-film transistor T1 is a N-type thin-film transistor; and the all-on signal GAS1 is a low voltage-level signal if the first thin-film transistor T1 is a P-type thin-film transistor.

In some embodiments, the all-off signal GAS2 is a high voltage-level signal if the second thin-film transistor T2 is a N-type thin-film transistor; and the all-off signal GAS1 is a low voltage-level signal if the second thin-film transistor T2 is a P-type thin-film transistor.

It needs to be noted that in the dual-side driving line-by-line scanning framework, the timing or clock for the GOA sub circuits at the two sides are the same, and accordingly the two GOA units of a same stage in the first GOA sub circuit and the second GOA sub circuit are fed with a same clock signal, or are fed with two clock signals of a same timing, respectively. For instance, the two GOA units of a same stage in the first GOA sub circuit and the second GOA sub circuit are fed with a same clock signal CK; alternatively, one GOA unit of the first GOA sub circuit is fed with a clock signal CKA and one GOA unit of the second GOA sub circuit at the same stage is fed with a clock signal CKB, where the clock signal CKA and the clock signal CKB are two clock signals of a same timing.

It needs to be noted that the all-off modules 101 act generally during a power-on phase or a power-down phase of the display panel and the all-on modules 102 act generally during a touch phase of the display panel.

Specifically, assuming that N-type thin-film transistors are adopted as the thin-film transistors of the pixels in the display panel, the thin-film transistors of the pixels are switched on when the scan signals are at high voltage level; and the thin-film transistors of the pixels are switched off when the scan signals are at low voltage level. The following is illustrated by taking a scan signal output end G(N−1) of a (N−1)th-staged GOA unit, a scan signal output end G(N)

of a Nth-staged GOA unit and a scan signal output end G(N+1) of a (N+1)th-staged GOA unit for example, and is to explain situations that the all-on signal GAS1 is at high voltage level or the all-off signal GAS2 is at high voltage level.

Figure 4A:
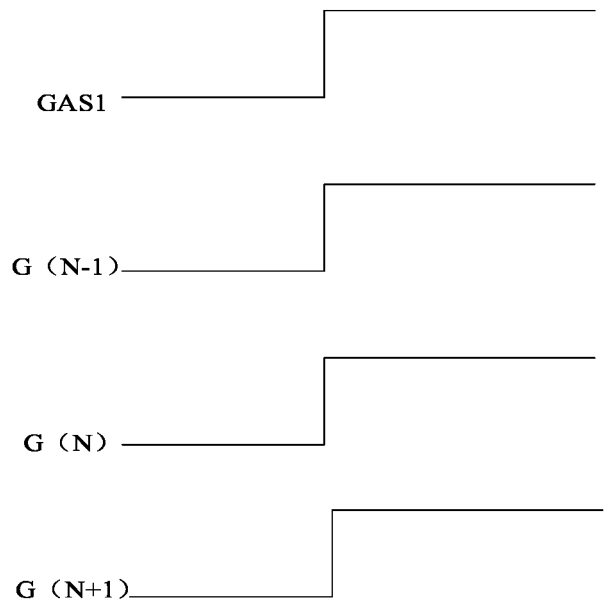
FIG. 4A is a schematic diagram showing the timing for an all-gate-on function of a GOA circuit provided in an embodiment of the present application.

FIG. 4A is a schematic diagram showing the timing for an all-gate-on function of a GOA circuit provided in an embodiment of the present application. Referring to FIGS. 2, 3 and 4A, when the all-on signal GAS1 is at high voltage level, all the scan signal output end G(N−1) of the (N−1)th-staged GOA unit, the scan signal output end G(N) of the Nth-staged GOA unit and the scan signal output end G(N+1) of the (N+1)th-staged GOA unit are at high voltage level, and the thin-film transistors of all pixels are switched on.

Figure 4B:
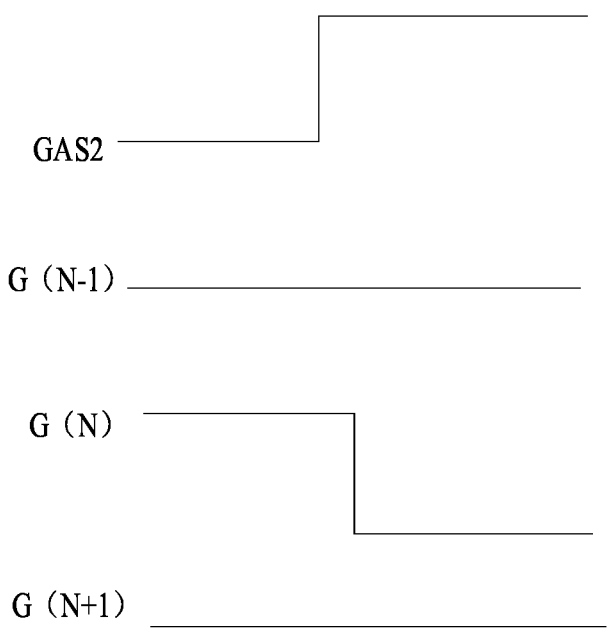
FIG. 4B is a schematic diagram showing the timing for an all-gate-off function of a GOA circuit provided in an embodiment of the present application.

FIG. 4B is a schematic diagram showing the timing for an all-gate-off function of a GOA circuit provided in an embodiment of the present application. Referring to FIGS. 2, 3 and 4B, when the all-off signal GAS2 is at high voltage level, all the scan signal output end G(N−1) of the (N−1)th-staged GOA unit, the scan signal output end G(N) of the Nth-staged GOA unit and the scan signal output end G(N+1) of the (N+1)th-staged GOA unit are at low voltage level, and all the pixels are switched off. In order to show that the scan signal at this moment is changed to low voltage level, it is assumed that the scan signal output end G(N) of the Nth-staged GOA unit is at high voltage level before this moment.

Figure 5:
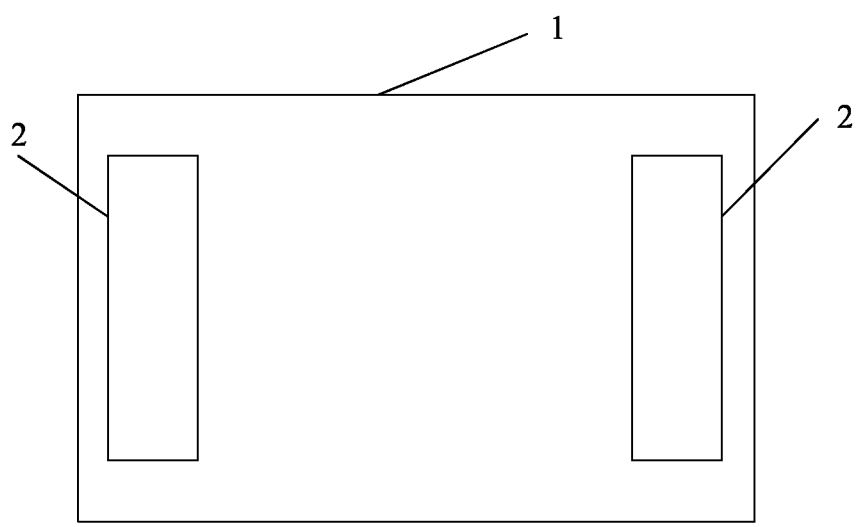
FIG. 5 is a structural schematic diagram illustrating a display panel provided in an embodiment of the present application.

Based on a same inventive concept, an embodiment of the present application further provides a display panel 1. FIG. 5 is a structural schematic diagram showing a display panel provided in an embodiment of the present application. As shown in FIG. 5, the display panel 1 includes the afore-described GOA circuit 2. The GOA circuit 2 includes the GOA sub circuits disposed at left and right sides of the display panel 1. Two GOA units at a same stage in the GOA sub circuits at the left and right sides are used to jointly drive a same row of pixels. The display panel 1 has a same structure and achieves a same beneficial effect as the GOA circuit 2, which are not repeated herein for that the GOA circuit 2 has been described in detail in above embodiments.

It needs to be emphasized that the display panel 1 should be a display panel in the dual-side driving line-by-line scanning framework since the GOA circuit 2 provided in the embodiment of the present application is only applicable to a display panel in the dual-side driving line-by-line scanning framework and is not suitable for a display panel in the dual-side driving interlaced scanning framework.

It should be understood that those of ordinary skill in the art may make equivalent modifications or variations according to the technical schemes and invention concepts of the present application, but all such modifications and variations should be within the appended claims of the present application.

The invention claimed is:

1. A gate driver on array (GOA) circuit, comprising:
a first GOA sub circuit disposed at one side of a display panel;
a second GOA sub circuit disposed at another side of the display panel; and
a plurality of cascaded GOA units disposed in the first GOA sub circuit and the second GOA sub circuit, wherein two GOA units of a same stage in the first GOA sub circuit and the second GOA sub circuit jointly drive a same scan line,
wherein one of the two GOA units of a same stage comprises one of an all-on module and an all-off module, and the other one of the two GOA units comprises the other one of the all-on module and the all-off module, and
wherein the all-on module is configured to simultaneously switch on thin-film transistors of all pixels connected to the scan line, and the all-off module is configured to simultaneously switch off the thin-film transistors of all the pixels connected to the scan line, and
wherein one of two cascaded GOA units in the first GOA sub circuit or the second GOA sub circuit only comprises the all-on module, and the other one of the two cascaded GOA units only comprises the all-off module.

2. The GOA circuit according to claim 1, wherein the all-on module comprises a first thin-film transistor, both a gate and a source of the first thin-film transistor are fed with an all-on signal, and a drain of the first thin-film transistor is connected to a corresponding scan signal output end.

3. The GOA circuit according to claim 1, wherein the all-off module comprises a second thin-film transistor, a gate of the second thin-film transistor is fed with an all-off signal, a source of the second thin-film transistor is fed with a constant low voltage level, and a drain of the second thin-film transistor is connected to a corresponding scan signal output end.

4. The GOA circuit according to claim 2, wherein the all-on signal is a high voltage-level signal if the first thin-film transistor is a N-type thin-film transistor; and the all-on signal is a low voltage-level signal if the first thin-film transistor is a P-type thin-film transistor.

5. The GOA circuit according to claim 3, wherein the all-off signal is a high voltage-level signal if the second thin-film transistor is a N-type thin-film transistor; and the all-off signal is a low voltage-level signal if the second thin-film transistor is a P-type thin-film transistor.

6. The GOA circuit according to claim 1, wherein the two GOA units of a same stage in the first GOA sub circuit and the second GOA sub circuit are fed with a same clock signal, or are fed with two clock signals of a same timing, respectively.

7. A display panel, comprising the GOA circuit according to claim 1.

8. The display panel according to claim 7, wherein the all-on module comprises a first thin-film transistor, both a gate and a source of the first thin-film transistor are fed with an all-on signal, and a drain of the first thin-film transistor is connected to a corresponding scan signal output end.

9. The display panel according to claim 7, wherein the all-off module comprises a second thin-film transistor, a gate of the second thin-film transistor is fed with an all-off signal, a source of the second thin-film transistor is fed with a constant low voltage level, and a drain of the second thin-film transistor is connected to a corresponding scan signal output end.

10. The display panel according to claim 8, wherein the all-on signal is a high voltage-level signal if the first thin-film transistor is a N-type thin-film transistor; and the all-on signal is a low voltage-level signal if the first thin-film transistor is a P-type thin-film transistor.

11. The display panel according to claim 9, wherein the all-off signal is a high voltage-level signal if the second thin-film transistor is a N-type thin-film transistor; and the all-off signal is a low voltage-level signal if the second thin-film transistor is a P-type thin-film transistor.

12. The display panel according to claim 7, wherein the two GOA units of a same stage in the first GOA sub circuit and the second GOA sub circuit are fed with a same clock signal, or are fed with two clock signals of a same timing, respectively.

* * * * *